(12) United States Patent
Kang

(10) Patent No.: US 7,265,411 B2
(45) Date of Patent: Sep. 4, 2007

(54) NON-VOLATILE MEMORY HAVING MULTIPLE GATE STRUCTURE

(75) Inventor: Sung-Taeg Kang, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/172,112

(22) Filed: Jun. 29, 2005

(65) Prior Publication Data
US 2006/0076607 A1    Apr. 13, 2006

(30) Foreign Application Priority Data
Sep. 30, 2004    (KR) .................... 10-2004-0077839

(51) Int. Cl.
*H01L 29/788*    (2006.01)
*H01L 29/76*    (2006.01)

(52) U.S. Cl. ............. 257/317; 257/319; 257/320; 257/321; 257/E29.129; 257/E29.3; 257/E29.422; 257/E21.68

(58) Field of Classification Search ........... 257/317, 257/319, 320, 321, E29.129, E29.3, E21.422, 257/E21.68
See application file for complete search history.

(56) References Cited

U.S. PATENT DOCUMENTS

| | | | | |
|---|---|---|---|---|
| 4,099,196 A | * | 7/1978 | Simko | 257/317 |
| 5,053,841 A | * | 10/1991 | Miyakawa et al. | 257/318 |
| 5,455,793 A | * | 10/1995 | Amin et al. | 365/185.26 |
| 5,963,806 A | * | 10/1999 | Sung et al. | 438/266 |
| 5,969,991 A | * | 10/1999 | Van Houdt et al. | 365/185.28 |
| 6,040,216 A | * | 3/2000 | Sung | 438/257 |
| 6,058,043 A | * | 5/2000 | Houdt et al. | 365/185.14 |
| 6,282,124 B1 | * | 8/2001 | Van Houdt et al. | 365/185.28 |
| 6,446,177 B1 | * | 9/2002 | Tanaka et al. | 711/163 |
| 6,486,509 B1 | * | 11/2002 | Van Houdt | 257/319 |
| 6,727,545 B2 | | 4/2004 | Wang et al. | |
| 6,747,310 B2 | * | 6/2004 | Fan et al. | 257/320 |
| 6,791,883 B2 | * | 9/2004 | Swift et al. | 365/185.29 |
| 6,876,031 B1 | * | 4/2005 | Kao et al. | 257/315 |
| 2005/0081076 A1 | * | 4/2005 | Okuda | 713/600 |

OTHER PUBLICATIONS

Jan Van Houdt, et al. "A Low-Cost Poly-Sidewall Erase HIMOS™ Technology For 130-90nm Embedded Flash Memories" IMEC, Kapeldreef 75, B3001 Leuven, Belgium, 2 pages.

* cited by examiner

*Primary Examiner*—Ngân V. Ngô
(74) *Attorney, Agent, or Firm*—Marger Johnson & McCollom, P.C.

(57) ABSTRACT

In one embodiment, a semiconductor device comprises an insulated floating gate disposed on a semiconductor substrate, an insulated program gate formed at least on a side surface of the floating gate, and an insulated erase gate disposed adjacent the floating gate.

39 Claims, 9 Drawing Sheets

NON-VOLATILE MEMORY HAVING MULTIPLE GATE STRUCTURE

CROSS REFERENCE TO RELATED APPLICATIONS

This application claims priority from Korean Patent Application 2004-0077839, filed on Sep. 30, 2004, the content of which is hereby incorporated by reference for all purposes.

BACKGROUND

1. Field of the Invention

This disclosure relates to semiconductor devices, and more particularly, to a non-volatile memory such as an EEPROM (Electrically Erasable and Programmable Read Only Memory) and method of manufacturing the same.

2. Description of the Related Art

FIG. 1 is a sectional diagram illustrating the structure of a conventional EEPROM unit cell, which has been introduced to overcome the problems such as disturbance between adjacent memory cells, which can result in unintended program or erase operations of the adjacent memory cells.

Referring to FIG. 1, the conventional EEPROM unit cell consists of a memory transistor 20 and a select transistor 30 disposed on a substrate 10. The substrate 10 includes a common source region 50 and a drain region 60. The source region 50 includes a double diffusion structure including an n$^+$ type high concentration impurity region 32 and an n$^-$ type low concentration impurity region 36. Likewise, the drain region 60 includes a double diffusion structure including an n$^+$ type high concentration impurity region 33 and an n$^-$ type low concentration impurity region 37. The length L1, or the distance between the source region 50 and the drain region 60, is the width of the conventional EEPROM unit cell.

The substrate 10 also includes a channel region 40 that consists of an n$^-$ type low concentration impurity region 35. An n$^+$ type high concentration impurity region 31 is disposed adjacent to the channel region 40, beneath the memory transistor 20.

The memory transistor 20 consists of a tunneling dielectric 15, a gate dielectric 17, a floating gate 21, an intergate insulating layer 22, a sense line 23, and spacers 18 disposed on the sidewalls of the floating gate 21, the intergate insulating layer 22, and the sense line 23.

The select transistor 30 consists of a word line 25 insulated from the substrate 10 by a gate dielectric 17. In addition, spacers 18 are disposed on the sidewalls of the word line 25. The length L2 is the distance between the sense line 23 and the word line 25. The conventional EEPROM unit cell overcomes the disturbance problem using the word line 25 which prevents the unintended program or erase operations of the nearby cells. Thus, with the conventional EEPROM unit cell, the sense line 23 and the word line 25 are required to be formed together.

Table 1 below illustrates the voltages that are applied to the conventional EEPROM unit cell during a charge, discharge, and read operation.

TABLE 1

| Operation Status | Sense Line 23 | Word Line 25 | Source region 50 | Drain region 60 | Substrate 10 |
|---|---|---|---|---|---|
| Charge (erase) | 15 V | 17 V | Floating | 0 V | 0 V |
| Discharge (program) | 0 V | 17 V | Floating | 15 V | 0 V |
| Read | 1.8 V | 1.8 V | 0 V | 0.5 V | 0 V |

During a charge or erase operation, a voltage of 15 V is applied to the sense line 23 and a voltage of 17 V is applied to the word line 25. The source region 50 is kept in a floating state while both the drain region 60 and substrate 10 are at a potential of 0 V. Fowler-Nordheim (F-N) tunneling occurs from the channel region 40 to the floating gate 21, having the effect of increasing the threshold voltage Vth of the device.

During a discharge or program operation of the device, a voltage of 0 V is applied to the sense line 23 and a voltage of 17 V is applied to the word line 25. The source region 50 is kept in a floating state while the drain region 60 has a voltage of 15 V applied to it, and the substrate 10 is held at 0 V. F-N tunneling occurs from the floating gate 21 to the channel region 40, having the effect of decreasing the threshold voltage Vth of the device.

During a read operation of the device, the "1" or "0" status of the device is read by sensing the charged or discharged status of the device. Both the sense line 23 and the word line 25 are maintained at a read voltage of about 1.8 V, while the drain region 60 is maintained at about 0.5 V. The source region 50 and the substrate 10 are at about 0V.

Disadvantages of the conventional EEPROM unit cell described above include that it has a relatively slow speed due to the F-N tunneling processes that occur during both the charge and discharge operations. Furthermore, both the sense line 23 and the word line 25 must be physically separated by a sufficient amount, thus the conventional EEPROM unit cell has a relatively large size. Also, because there is not enough photolithographic process margin, the fabrication of EEPROM devices has been difficult. In addition, as the semiconductor devices become highly-integrated, i.e., scaled down, the punchthrough or program disturbance between the memory cells have become more serious problems especially with the high voltage being applied to the junction regions. Thus, additional reduction of cell sizes in conventional devices have been significantly limited.

Embodiments of the invention address these and other disadvantages of the conventional art.

SUMMARY

According to one aspect of the present invention, a semiconductor device comprises an insulated floating gate disposed on a semiconductor substrate; an insulated program gate formed at least on a side surface of the floating gate; and an insulated erase gate disposed adjacent the floating gate.

According to another aspect of the present invention, a semiconductor comprises a gate dielectric layer formed on a semiconductor substrate; a floating gate overlying the gate dielectric layer, the floating gate having a first side surface, a second side surface opposite the first side surface, and a top surface thereof; an insulated program gate having a side portion located at least along the first side surface, the program gate overlying the gate dielectric layer; an erase gate disposed adjacent the floating gate, the erase gate located at least along the second side surface, the erase gate overlying the gate dielectric layer; a coupling dielectric disposed between the floating gate and the program gate; a tunneling dielectric layer disposed between the floating gate and the erase gate; and a first impurity region and a second impurity region formed in the semiconductor substrate along opposite sides of the floating gate.

BRIEF DESCRIPTION OF THE DRAWINGS

The aspects and advantages of the present invention will become more apparent with the detailed description of the exemplary embodiments with reference to the attached drawings.

DETAILED DESCRIPTION

In the following description, several exemplary embodiments of the invention are described. These exemplary embodiments are not intended to be limiting in any way, but rather to convey the inventive aspects contained in the exemplary embodiments to those skilled in this art. Those skilled in this art will recognize that various modifications may be made to the exemplary embodiments without departing from the scope of the invention as defined in the attached claims.

Figure 1:
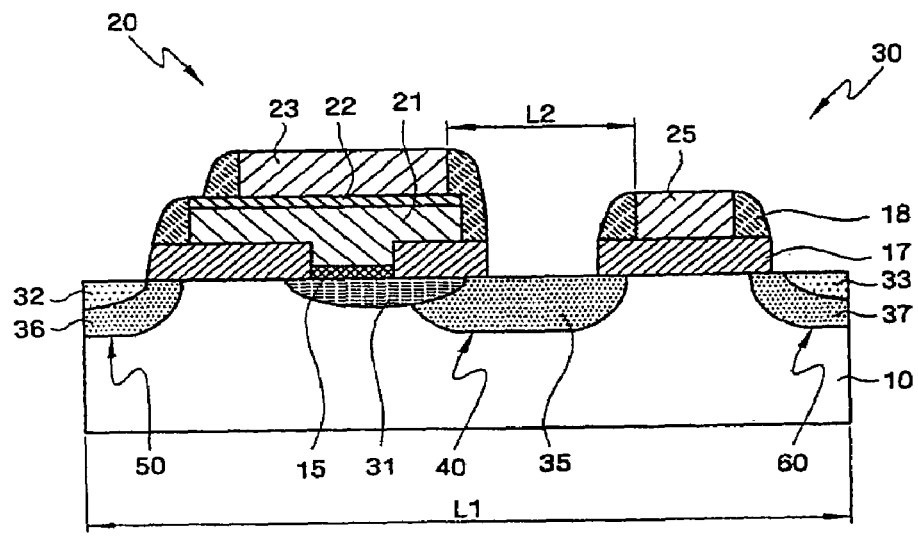
FIG. 1 is a sectional diagram illustrating a conventional EEPROM unit cell.
Figure 2:
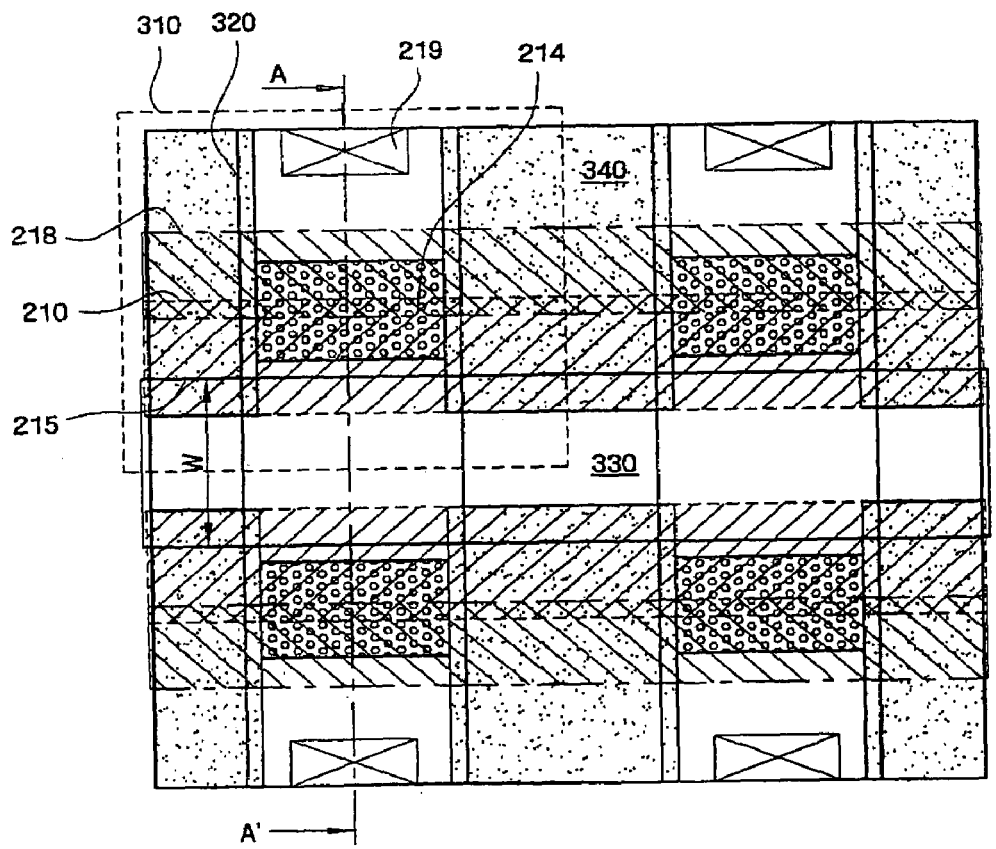
FIG. 2 is a plan diagram illustrating an array of several EEPROM unit cells in accordance with embodiments of the invention.

FIG. 2 is a plan diagram illustrating an array of several EEPROM cells in accordance with embodiments of the invention. While the features illustrated in FIG. 2 are out of necessity represented on a single sheet of paper, the features do not necessarily occupy the same horizontal plane.

With reference to FIG. 2, two bit lines 320 are shown. The line A-A' bisects one of the bit lines 320 along the length of the bit line 320. The line A-A' also bisects an area that contains a non-volatile memory unit cell such as an EEPROM unit cell 310.

Drain regions or second impurity regions 219 are disposed on either side of a source region or first impurity region 215 of width W. The source region 215 is arranged orthogonally with respect to the bit lines 320. Although it is not necessary, the first impurity region 215 may be a common source region shared by a pair of non-volatile memory unit cells as shown. Thus, the device size can be reduced. An isolation region 340, represented by the randomly dotted areas, defines active regions 330.

A control gate or erase gate 218 and a program gate 210 extend in the same direction as the common source region 215, and it may be seen that the erase gate 218 and the program gate 210 are overlapped. However, the erase gate 218 and the program gate 210 need not be overlapped.

Floating gates 214 may be overlapped by the erase gate 218, the program gate 210, or both. Alternatively, the floating gates 214 may be overlapped by neither of the program gate 210 or the erase gate 218 depending on applications as will be explained further below.

Figure 3A:
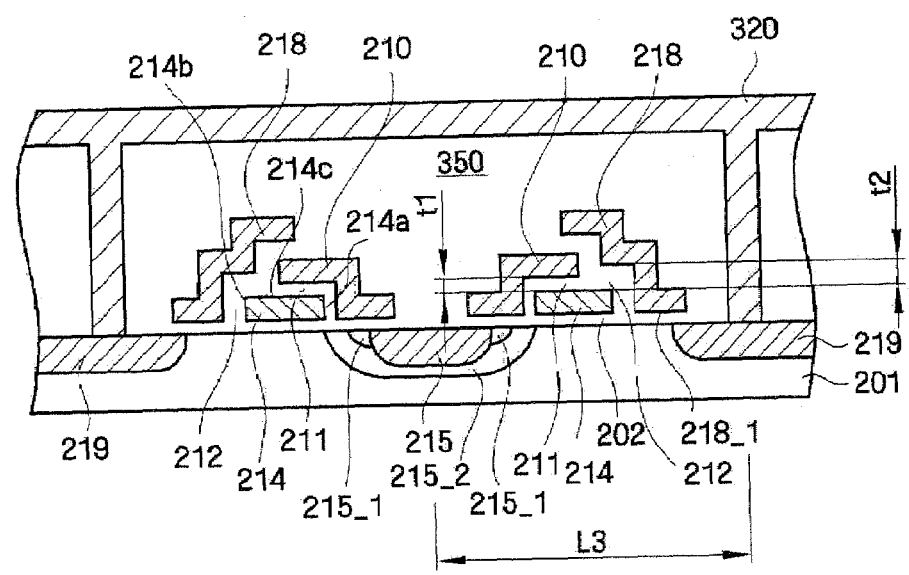
FIG. 3A is a sectional diagram illustrating EEPROM unit cells in accordance with some embodiments of the invention.
Figure 3B:
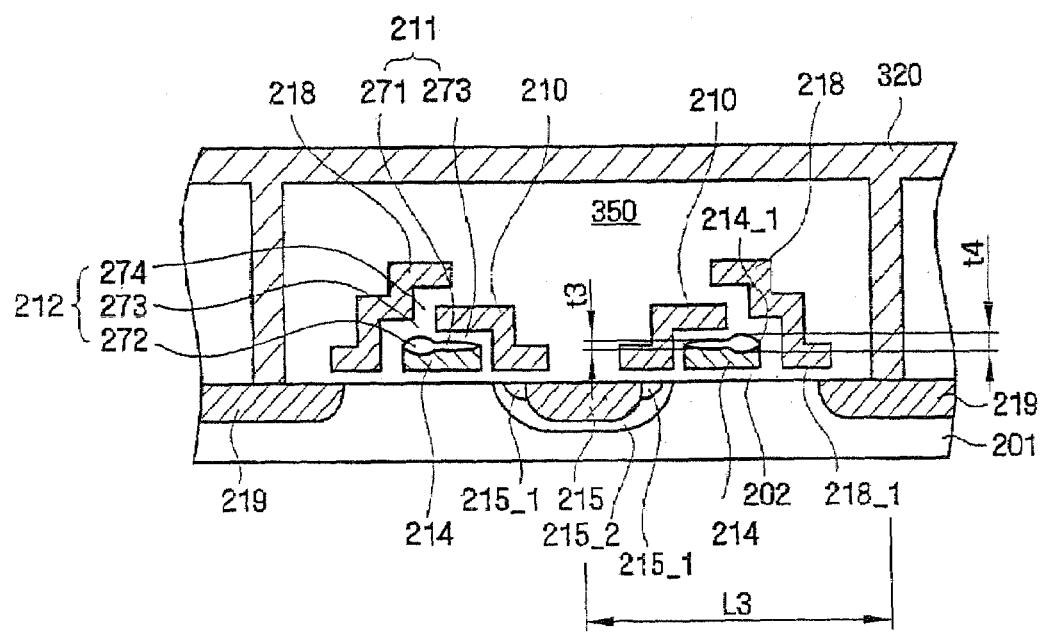
FIG. 3B is a sectional diagram illustrating EEPROM unit cells in accordance with other embodiments of the invention.

FIG. 3A is a sectional diagram illustrating EEPROM unit cells in accordance with some embodiments of the invention. FIG. 3B is a sectional diagram illustrating EEPROM unit cells in accordance with other embodiments of the invention. Both FIGS. 3A and 3B are cross-sectional diagrams taken along line A-A' of FIG. 2. The exemplary embodiments illustrated in FIGS. 3A and 3B share many similarities, and unless otherwise indicated, the following description applies equally well to both FIG. 3A and FIG. 3B.

Referring to FIGS. 3A and 3B, the drain regions 219 and the source region 215 are formed in a substrate 201 such as a silicon substrate, silicon on insulator (SOI), GaAs substrate, SiGe substrate, or glass substrate, using conventional techniques such as ion implantation. The length L3, which is the distance from the center of a drain region 219 to the center of the common source region 215, is the width of a single EEPROM unit cell. Thus, two EEPROM unit cells are illustrated in each of FIGS. 3A and 3B for explaining the concept of the present invention.

The substrate 201 includes a Lightly Doped Drain (LDD) region 215_1, which is disposed on either side of the common source region 215. With the LDD region 215_1, junction breakdown can be restricted, even when the high voltage is applied to the common source region 215. The source region 215 and the LDD region 215_1 may include a halo region 215_2. In other words, a halo implant region 215_2 is formed adjacent a side of the common source region 215. The halo region 215_2 may prevent punch-through. Also, the halo region 215_2 is helpful for generating electrons from the drain 219 region toward the common source region 215 during a write operation.

The bit line 320 overlies the EEPROM unit cells, and portions of the bit line 320 extend vertically through an interlayer dielectric 350 to contact the drain regions 219.

The EEPROM unit cells illustrated in FIGS. 3A and 3B include the floating gate 214, the program gate 210, and the erase gate 218. A gate dielectric layer 202 formed of an insulating material such as silicon dioxide is disposed between the substrate 201 and lower portions of the floating gate 214, the program gate 210, and the erase gate 218. The program gate 210 may be disposed on one side of the floating gate 214 and partially overlaps the floating gate 214. In other words, the program gate 210 may include a top portion located above a region of the top surface of the floating gate 214. The erase gate 218 may be disposed on the other side of the floating gate 214, and partially overlaps the floating gate 214. The erase gate 218 may also overlap the top portion of the program gate 210. In addition, the program gate 210 and/or erase gate 218 may not overlap the floating gate 210 at all depending on applications as long as the device can perform necessary operations. Preferably, the floating gate 214 may have a tip 214_1 formed at an edge thereof and the erase gate 218 has a top portion that directly overlies or close to the tip so that tunneling (discharge) of electrons accumulated in the floating gate 214 can effectively occur between the floating gate 214 and the erase gate

218. The erase gate 218 also has a lower portion 218_1 extending over an upper surface of the substrate 201 and having a channel region thereunder in the substrate 201.

Referring only to FIG. 3A, a first dielectric layer or coupling dielectric layer 211 is disposed between the floating gate 214 and the program gate 210. A second dielectric layer or tunneling dielectric layer 212 is disposed between the program gate 210 and the erase gate 218. Both the first dielectric layer 211 and the second dielectric layer 212 may be disposed between the floating gate 214 and the erase gate 218.

Continuing to refer only to FIG. 3A, the thickness t1 refers to both the thickness of the first dielectric layer 211 and the distance between an upper horizontal surface of the floating gate 214 and an adjacent horizontal surface of the program gate 210. The thickness t2 refers to the thickness of the second dielectric layer 212, as well as the distance between the upper horizontal surface of the floating gate 214 and an adjacent horizontal surface of the erase gate 218.

Referring only to FIG. 3B, an oxidation layer 271 and a first insulating layer 273 are disposed between the floating gate 214 and the program gate 210 to form a coupling dielectric layer 211. An oxidation layer 272, the first insulating layer 273, and a second insulating layer 274 are sequentially stacked or formed between the floating gate 214 and the erase gate 218 to form a tunneling dielectric layer 212.

The oxidation layers 271 and 272 are both disposed on an upper surface of the floating gate 214, and although they are referred to for convenience as being individual entities, they are in fact one continuous oxidation layer 271/272 differing in thicknesses depending on locations. However, the oxidation layer 272 is thicker than the oxidation layer 271, for reasons that will be explained in more detail in the description that follows. The thickness t3 refers to the thickness of the oxidation layer 271, while the thickness t4 refers to the thickness of the oxidation layer 272.

Therefore, according to one embodiment of the present invention, a memory cell 310 or semiconductor device comprises a gate dielectric layer 202 formed on a semiconductor substrate 201. The semiconductor device further includes a floating gate 214 overlying the gate dielectric layer 202. The floating gate 214 has a first side surface 214A, a second side surface 214B opposite the first side surface 214A, and a top surface thereof 214C. The semiconductor device additionally includes an insulated program gate 210 having a side portion located at least along the first side surface 214A and overlying the gate dielectric layer 202. The semiconductor device also includes an erase gate 218 disposed adjacent the floating gate 214. In particular, the erase gate 218 may be located at least along the second side surface and overlies the gate dielectric layer 202.

Preferably, as shown in FIG. 3A, the erase gate 218 may be formed self aligned with the shapes of the program gate 210 and/or the floating gate 214. Therefore, process margins are effectively improved. If the erase gate 218 and the program gate 210 were formed at the same time with a single photolithography process, it would be extremely difficult to manufacture the device due to the very small photolithographic process margins considering the short distance required between the erase gate 218 and the program gate 210.

The program gate 210 may have a thickness ranging from about 1,000 angstroms to 3,000 angstroms. In addition, the floating gate 214 may have a thickness ranging from about 500 angstroms to about 2,500 angstroms. Also, the erase gate 218 may have a thickness ranging from about 1,000 angstroms to 3,000 angstroms.

Further, the semiconductor device includes a coupling dielectric layer 211 disposed between the floating gate 214 and the program gate 210 to have a coupling capacitance therebetween. The device additionally includes a tunneling dielectric layer 212 disposed between the floating gate 214 and the erase gate 218, a first impurity region 215 and a second impurity region 219 formed in the semiconductor substrate 201 along opposite sides of the floating gate 214. The gate dielectric layer 202 may be thicker than the coupling dielectric layer 211. The tunneling dielectric layer may include a thermal oxide layer and a chemical vapor deposition (CVD) insulating layer, which are sequentially formed.

During the program operation, with a high voltage being applied to the first impurity region 215, the floating gate 214 is induced into a predetermined voltage by a coupling phenomenon through the coupling dielectric layer 211 such that the charges or electrons generated between the first impurity region 215 and the second impurity region 219 are injected and accumulated in the floating gate 214 through the gate dielectric layer 202. Also, with the erase gate 218, during the program or read operations, data can be input to the memory unit cell 310 through the bit line 320 or the data stored in the unit cell 310 can be output to the bit line 320.

On the other hand, the thickness of the coupling dielectric layer 211 may range from about 40 angstroms to about 200 angstroms. More preferably, the thickness of the coupling dielectric layer 211 ranges from about 60 angstroms to 120 angstroms.

According to one aspect of the present invention, a capacitive coupling ratio between the program gate 210 and the floating gate 214 may be greater than a capacitive coupling ratio between the program gate 210 and the erase gate 218. As a result, during the erase operation, the electrons accumulated in the floating gate 214 can be discharged to the erase gate 218 through the tunneling dielectric layer 212 by a F-N tunneling process.

In particular, if the capacitive coupling ratio between the floating gate 214 and the erase gate 218 is lower, a relatively lower voltage is induced into the floating gate 214 such that the electrons accumulated in the floating gate 214 can be more effectively discharged through the tunneling dielectric layer 212 by the F-N tunneling process due to high voltage, e.g., 10-13 V, applied in the erase gate 218. Likewise, during the program operation, if the capacitive coupling ratio between the program gate 210 and the floating gate 214 is greater, a relatively higher voltage is induced in the floating gate 214 such that the electrons can be injected in the floating gate 214 more effectively through the gate dielectric layer 202.

Accordingly, the thickness of the coupling dielectric layer 211 may be less than or approximately equal to thickness of the tunneling dielectric layer 212. Preferably, the thickness of the tunneling dielectric layer 212 may be greater than or equal to the thickness of the coupling dielectric layer 211, but not greater than three times the thickness of the coupling dielectric layer 211. One skilled in the art will appreciate that the thickness of the tunneling dielectric layer 211 may be thin enough to allow F-N tunneling between the floating gate 214 and the erase gate 218. According to some embodiments of present invention, the thicknesses described above may be a closest distance measured from the edge of the floating gate 214 to either the program gate 210 or the erase gate 218.

Further, according to another aspect of the present invention, the floating gate 214 and the program gate 210 has a first overlapping area therebetween and the program gate 210 and the erase gate 218 has a second overlapping area therebetween. Preferably, for the reasons discussed above, the first overlapping area is greater than the second overlapping area such that a capacitive coupling ratio between the program gate 210 and the floating gate 214 may be greater than a capacitive coupling ratio between the program gate 210 and the erase gate 218. Preferably, the first overlapping area may be at least about 2 times the size of the second overlapping area and about 5 times greater than the second overlapping area. If the first overlapping area is about 5 times greater than the second overlapping area, the erase operation may not be effectively performed as the second overlapping area is too small for the electrons to be discharged to the erase gate 218.

In addition, according to still another aspect of the present invention, a ratio of the overlapping length between the floating gate 214 and the program gate 210 to the overlapping length between the floating gate 214 and the erase gate 218 ranges from about 5:1 to about 20:1. More preferably, the ratio is about 10:1.

According to yet another aspect of the present invention, the common source region or first impurity region 215 may partially overlap with the program gate 210 to form a channel region under the program gate 210 in the substrate 201. In this case, with the formation of additional transistor including this channel region under the substrate 201, the disturbance problem of the prior art can be further prevented by controlling the electric current flowing therethrough. Alternatively, the first impurity region 215 may fully overlap with the program gate 210.

According to another embodiment of the present invention, the semiconductor device further comprises a selection transistor (not shown) coupled to the erase gate 218 for byte operation.

FIGS. 4A through 4G are cross-sectional diagrams illustrating exemplary processes for manufacturing EEPROM unit cells in accordance with the embodiments illustrated in FIG. 3A. FIGS. 4A-4H have the same perspective as FIG. 3A, that is, they illustrate cross-sections along the same vertical plane as FIG. 3A.

Figure 4A:
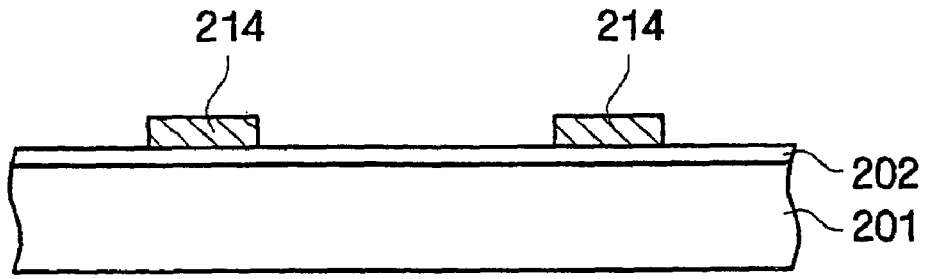
FIGS. 4A-4G are sectional diagrams illustrating exemplary processes for manufacturing EEPROM unit cells in accordance with the embodiments illustrated in FIG. 3A.

Referring to FIG. 4A, a gate dielectric layer 202 is deposited on a substrate 201. Preferably, the gate dielectric layer 202 such as a thermal oxide that is about 50 to about 150 angstroms thick. Next, a polysilicon layer (not shown) is deposited on the gate dielectric layer 202 and patterned using known techniques to form floating gates 214. Preferably, the floating gates 214 are about 500 angstroms to about 2,500 angstroms thick.

Figure 4B:
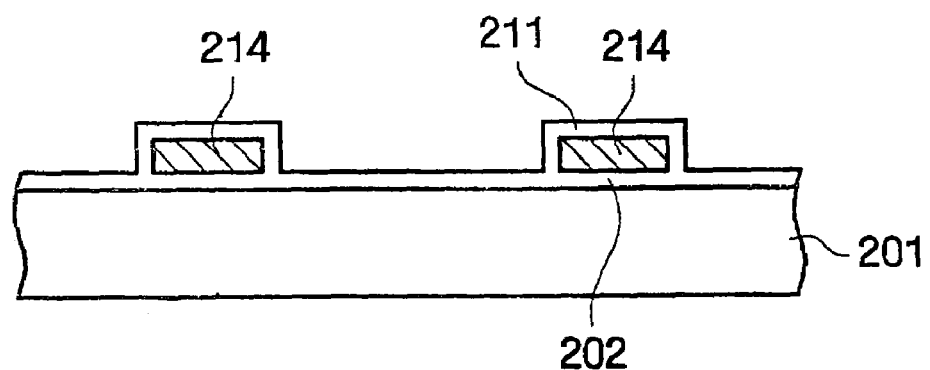

Referring to FIG. 4B, a first dielectric layer 211 is deposited on the floating gates 214 to a thickness of about 40 angstroms to 200 angstroms, preferably 60 angstroms to about 120 angstroms. Preferably, the first dielectric layer 211 is formed using a chemical vapor deposition (CVD) process and a high temperature oxide (HTO). Alternatively, the first dielectric layer 211 may be formed using a thermal oxidation process and a medium temperature oxide (MTO). The thickness of the first dielectric layer 211 is represented as t1 in FIG. 3A and FIG. 4G.

Figure 4C:
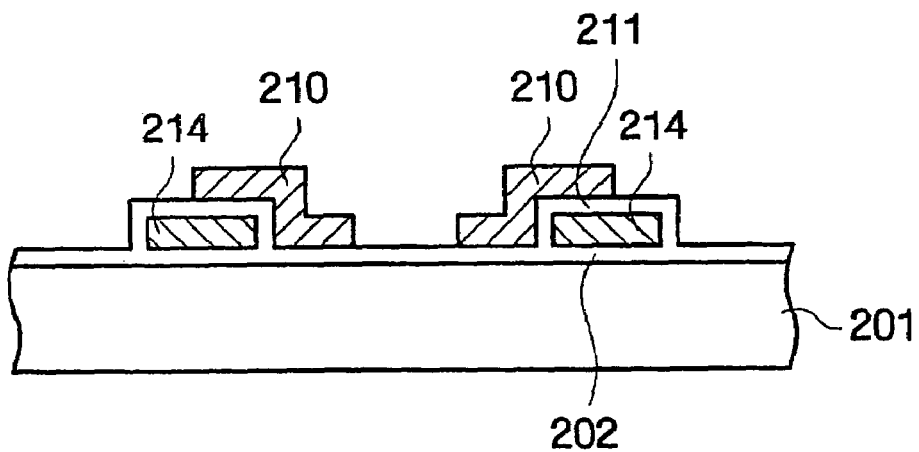

Referring to FIG. 4C, a polysilicon layer (not shown) is deposited on the gate dielectric layer 202 and the first dielectric layer 211. Next, the polysilicon layer is patterned using known techniques to form program gates 210. Preferably, the program gates 210 are about 1,000 angstroms to 3,000 angstroms thick.

Figure 4D:
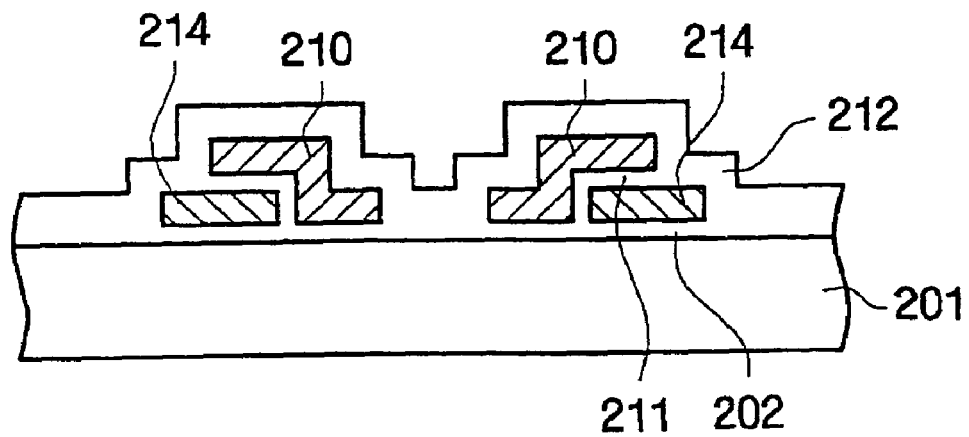

Referring to FIG. 4D, a second dielectric layer 212 is deposited on the program gates 210, the first dielectric layer 211, and the gate dielectric layer 202. Preferably, the second dielectric layer 212 is formed using a chemical vapor deposition (CVD) process and a high temperature oxide (HTO). Alternatively, the second dielectric layer 212 may be formed using a thermal oxidation process and a medium temperature oxide (MTO). The thickness of the second dielectric layer 212 is represented as t2 in FIG. 3A and FIG. 4G. Preferably, the thickness t2 of the second dielectric layer 212 is greater than or equal to the thickness of the first dielectric layer 211, but not greater than three (3) times the thickness t1 of the first dielectric layer 211. More preferably, the thickness t2 of the second dielectric layer 212 is about 1.3 to 3 times the thickness t1 of the first dielectric layer 211.

Figure 4E:
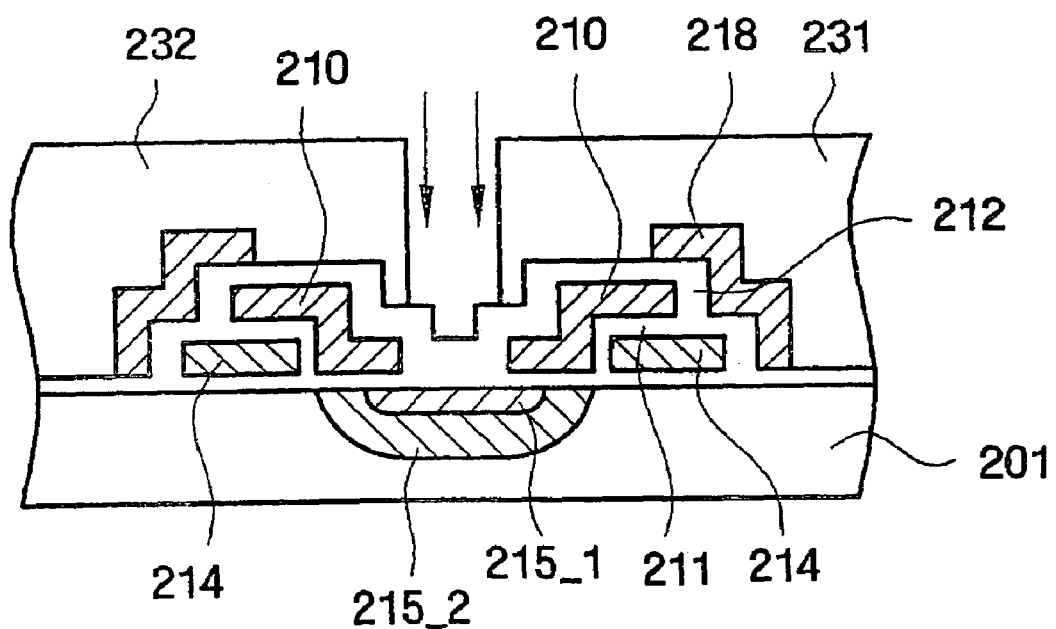

Referring to FIG. 4E, a polysilicon layer (not shown) is deposited on the second dielectric layer 212. Next, the polysilicon layer is patterned using known techniques to form erase gates 218. Thus, the erase gates 218 are formed self-aligned with shapes of the floating gate 214 and/or the program gate 210. Preferably, the erase gates 218 are about 1,000 angstroms to about 3,000 angstroms thick.

Next, a photoresist layer (not shown) is deposited on the erase gates 218, the second dielectric layer 212, and the gate dielectric layer 202. A photolithography process is then used to form mask layers 231, 232 that expose a central region of the second dielectric layer 212 that is between the program gates 210. A p-type ion implantation is used to create the halo region 215_2 using known techniques. For example, the p-type ion implantation is performed at a dose of about $10^{15}$ ions/cm$^2$ using impurities such as As or P. An n-type ion implantation is used to create the LDD region 215_1. For example, the n-type ion implantation is performed at a dose of about $10^{13}$ ions/cm$^2$. The mask layers 231, 232 are removed.

Figure 4F:
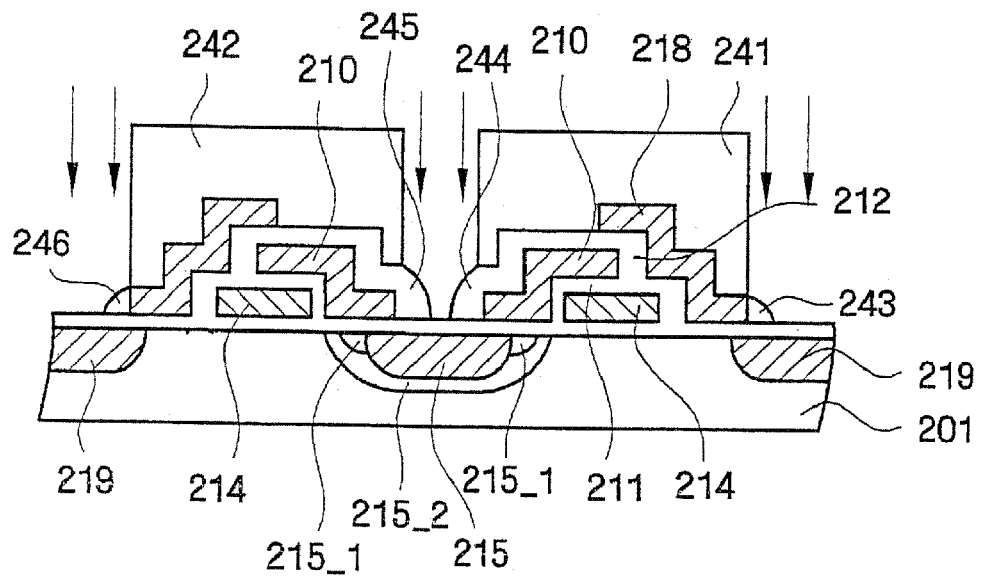

Referring to FIG. 4F, a photoresist layer (not shown) is deposited on the erase gates 218, the second dielectric layer 212, and the gate dielectric layer 202. A photolithography process is then used to form mask layers 241, 242 that expose the central region between the two program gates 210 as well as regions adjacent to the erase gates 218.

An oxide layer is deposited in the exposed regions and then etched using known techniques to form spacers 243, 244, 245, and 246. Then, an n$^-$ type ion implantation is performed to create the source region 215 within the halo region 215_2 and drain regions 219 in the regions of the substrate 201 adjacent to the erase gates 218. For example, the n$^-$ type ion implantation is performed at a dose of about $10^{15}$ ions/cm$^2$. The mask layers 241, 242 and the spacers 243, 244, 245, 246 are removed.

Figure 4G:
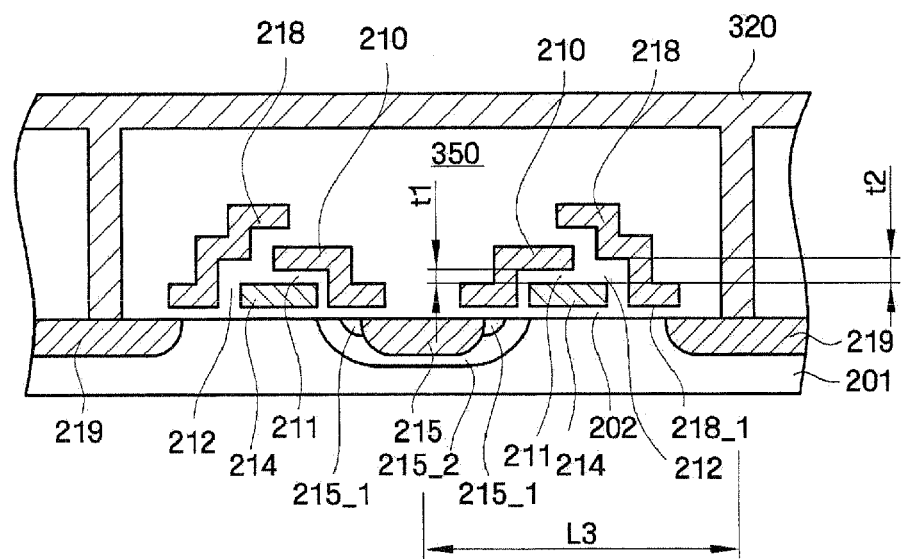

Referring to FIG. 4G, an interlayer dielectric layer (not shown) is deposited over the resulting structure of FIG. 4F. The interlayer dielectric layer is etched using known techniques to form the interlayer dielectric 350 and via holes that expose the drain regions 219. Then, a conductive material is deposited on the interlayer dielectric 350 to fill the via holes and form the bit line 320.

FIGS. 5A through 5F are sectional diagrams illustrating exemplary processes for manufacturing EEPROM unit cells in accordance with the embodiments illustrated in FIG. 3B. FIGS. 5a-5f have the same perspective as FIG. 3B, that is, they illustrate cross-sections along the same vertical plane as FIG. 3B.

Figure 5A:
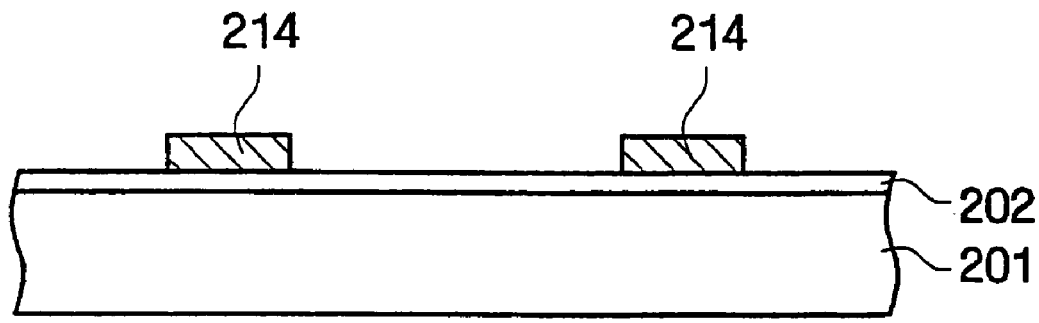
FIGS. 5A-5F are sectional diagrams illustrating exemplary processes for manufacturing EEPROM unit cells in accordance with the embodiments illustrated in FIG. 3B.

Referring to FIG. 5A, a gate dielectric layer 202 is deposited on a substrate 201. The gate dielectric layer 202 may comprises a thermal oxide that is about 50 angstroms to 150 angstroms thick. Next, a polysilicon layer (not shown) is deposited on the gate dielectric layer 202 and patterned using known techniques to form floating gates 214. The floating gates 214 may be about 500 angstroms to about 2,500 angstroms thick.

Figure 5B:
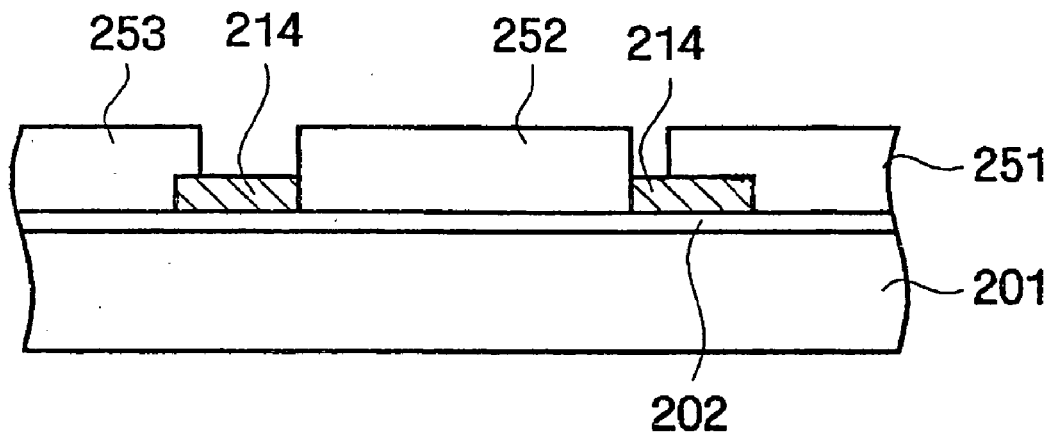

Referring to FIG. 5B, a mask layer (not shown) is deposited on the structure of FIG. 5A and patterned to form the masks 251, 253. The masks 251, 253 partially expose the upper surfaces of floating gates 214. Using the masks 251, 253, a $N_2$ (nitrogen) implantation is performed on the exposed surface of the floating gates 214. The masks 251, 253 are then removed.

Figure 5C:
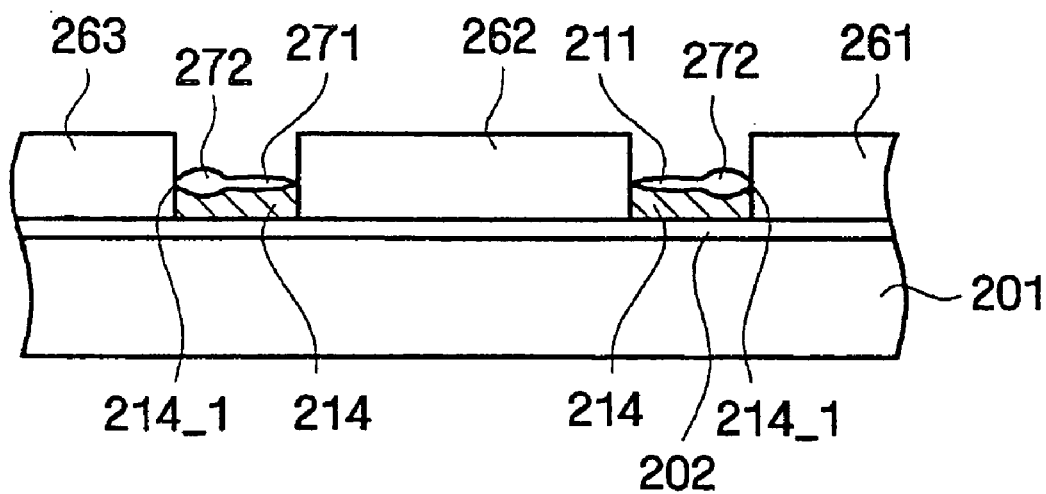

Referring to FIG. 5C, a mask layer (not shown) is deposited on the gate dielectric layer 202 and the floating gates 214. The mask layer is then patterned to form masks 261, 262, 263. The masks 261, 262, 263 expose the upper surfaces of floating gates 214. Using the masks, a thermal oxidation process is performed to form the oxidation layers 271, 272. Typically, the region of the floating gates 214 where the nitrogen implantation was performed experiences less oxidation then the regions that were covered by the masks 251, 252. Thus, a thickness of the oxidation layer 271 is thinner than that of the oxidation layer 272. The masks 261, 262, 263 are then removed. 20. In other words, it may be said that the floating gate 214 has an undulating thickness that forms an uneven surface having a tip formed at an edge thereof.

Figure 5D:
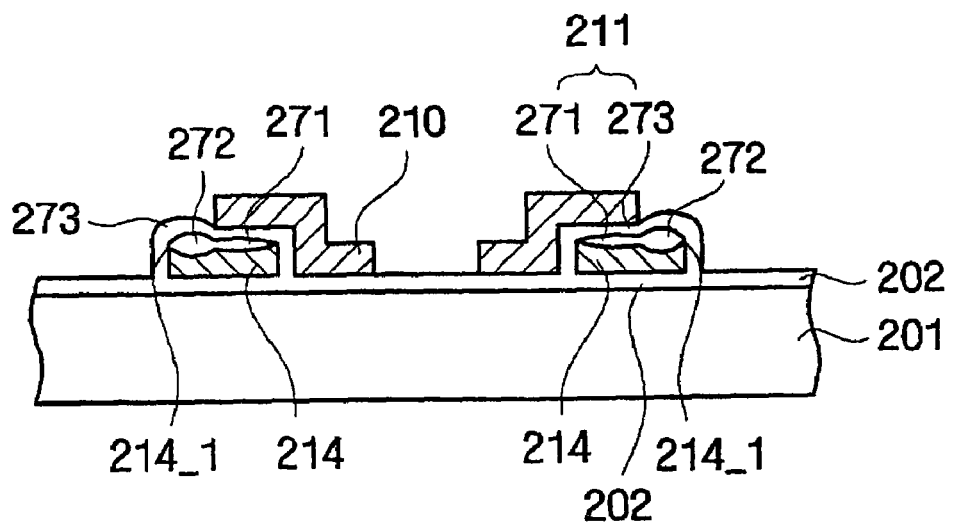

Referring to FIG. 5D, a first dielectric layer 273 is deposited on sidewalls of the floating gate 214 and upper surfaces of the oxidation layers 271, 272 to a thickness of about 50 angstroms to about 200 angstroms. Preferably, the first dielectric layer 273 is formed using a chemical vapor deposition (CVD) process and a high temperature oxide (HTO). Alternatively, the first dielectric layer 273 may be formed using a thermal oxidation process and a medium temperature oxide (MTO).

A polysilicon layer (not shown) is then deposited on the resulting structure. Next, the polysilicon layer is patterned using known techniques to form program gates 210. For example, the program gates 210 are about 1,000 angstroms to about 3,000 angstroms thick.

Figure 5E:
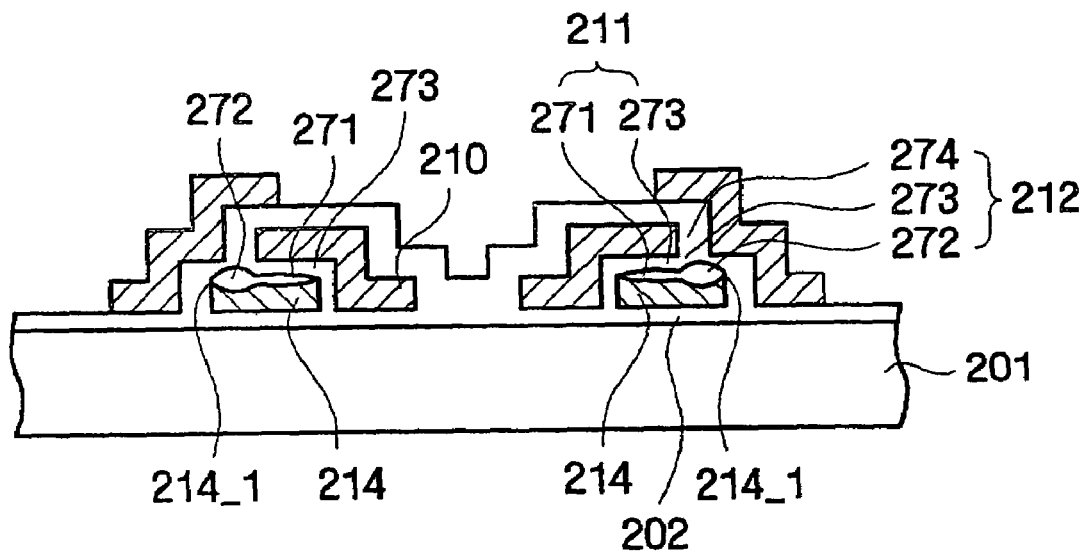

Referring to FIG. 5E, a second dielectric layer 274 is deposited on the program gates 210, the first dielectric layer 273, and the gate dielectric layer 202. Preferably, the second dielectric layer 274 is formed using a chemical vapor deposition (CVD) process and a high temperature oxide (HTO). Alternatively, the second dielectric layer 274 may be formed using a thermal oxidation process and a medium temperature oxide (MTO).

A polysilicon layer (not shown) is then deposited on the resulting structure. Next, the polysilicon layer is patterned using known techniques to form erase gates 218. Preferably, the erase gates 218 are about 1,000 angstroms to 3000 angstroms thick.

Figure 5F:
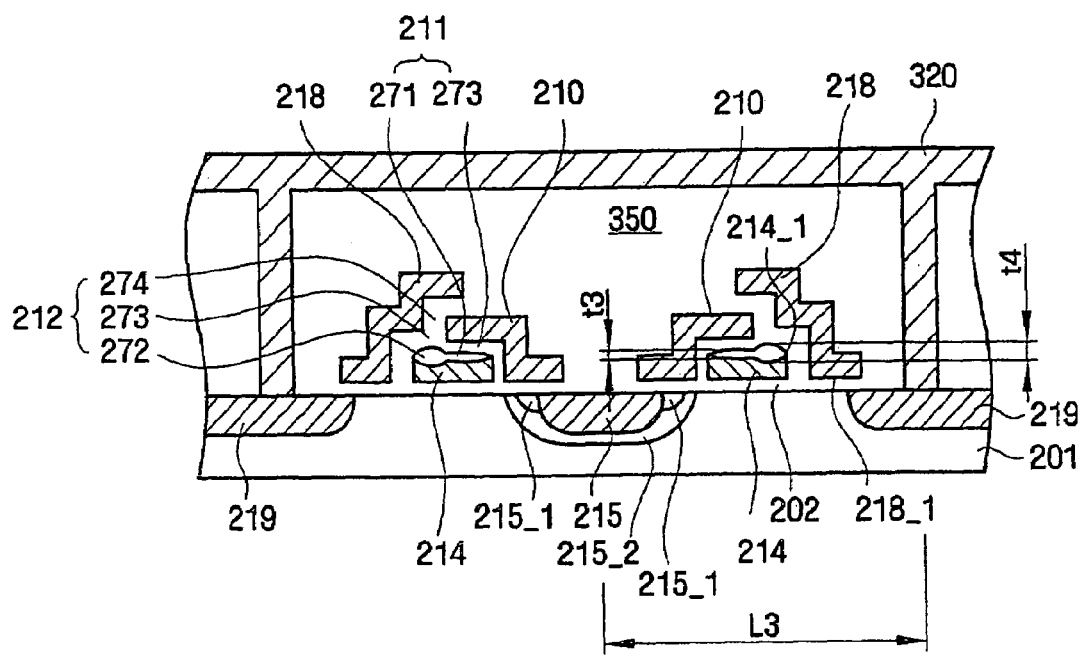

Referring to FIG. 5F, the processes used to form the drain regions 219, the source region 215, the LDD region 215_1, the halo region 215_2, the interlayer dielectric 350, and the bit line 320 are preferably the same as the processes that were described above for the previous embodiments. That is, the processes related to FIGS. 4E, 4F, and 4G for the previous embodiments are equally applicable to the embodiments illustrated in FIG. 3B and FIG. 5F. Therefore, an unduly repetitive explanation of the processes that may be used to transition from FIG. 5E to FIG. 5F is omitted. In FIG. 5F, the thickness t3 refers to the thickness of the oxidation layer 271, while the thickness t4 refers to the thickness of the oxidation layer 272.

As described above, the thickness of the tunneling dielectric layer 212, that is, the thickness of the dielectric layer between the erase gate 218 and the floating gate 214, is preferably thicker than the coupling dielectric layer 211, or the dielectric layer between the program gate 210 and the floating gate 214. These varying thicknesses, overlapping areas and/or lengths ensure that the program gate 210 contributes more electric field to floating gate 214 than the erase gate 218. For example, during a write operation of the device, the erase gate 218 may have a voltage of about 1.5 V and the program gate 210 may have a potential of about 10 V. When these voltages are applied, the voltage of the floating gate 214 may be lowered because the erase gate 218 can give the floating gate 214 the erase gate voltage coincidentally.

Also, according to embodiments of the present invention, both the voltages, e.g., 3-6 V, applied to the junction regions and the voltages, e.g., 5-10 V, applied from the program gate 210 lead to coupling of the floating gate 210. Thus, the charge or discharge operations can be performed with significantly lower voltages compared to the prior art because the coupling of the floating gate 214 needs not rely on a high voltage, such as 15 V, that is applied to the junction regions.

Table 2 below illustrates exemplary voltages that may be applied to the embodiments of the invention described above during charge, discharge, and read operations of the EEPROM unit cell.

TABLE 2

| Operation Status | Erase gate 218 | Program gate 210 | Source region 215 | Drain regions 219 |
|---|---|---|---|---|
| Write (charge) | Vth | 5~10 V | 3~6 V | 0 V |
| Erase (discharge) | 10~13 V | 0 V | 0 V | 0 V |
| Read | 1~2 V | 1~2 V | 0 V | 0.4~1 V |

During a write (charge) operation, the threshold voltage Vth, usually about 1.5 V, is applied to the erase gate 218, the program gate 210 is at a potential of about 5 to 10 V, the source region 215 is at a potential of about 3 to 6 V, and the drain regions 219 are at a potential of approximately 0 V. Accordingly, hot electrons generated from the drain region 219 move toward the common source region 215 and accumulate in the floating gate 214 after passing through the gate dielectric layer 202. Because the program gate 210 is disposed above the floating gate 214, the coupling effect can be increased during the write operation.

During an erase (discharge) operation, a voltage of about 10 to 13 V is applied to the erase gate 218, and the program gate 210, the source region 215, and the drain regions 219 are all at approximately 0 V. A higher coupling ratio is more desirable during the write operation and a lower coupling ratio is more desirable during the erase operation. According to an aspect of the present invention, even when the high voltage, e.g., 10-13 V, is applied to the erase gate 218, the coupling ratio can still be relatively low because the program gate 210 at the potential of 0 V disposed on the floating gate 214 reduces the coupling effect between the erase gate 218 and the floating gate 214. Therefore, even with a relatively lower voltage compared to the prior art, the erase operation can be successfully performed.

During a read operation, a voltage of about 1 to 2 V is applied to the erase gate 218 and the program gate 210. The source region 215 has a voltage of about 0 V, and the drain regions 219 have a voltage of about 0.4 to 1 V.

Figure 6:
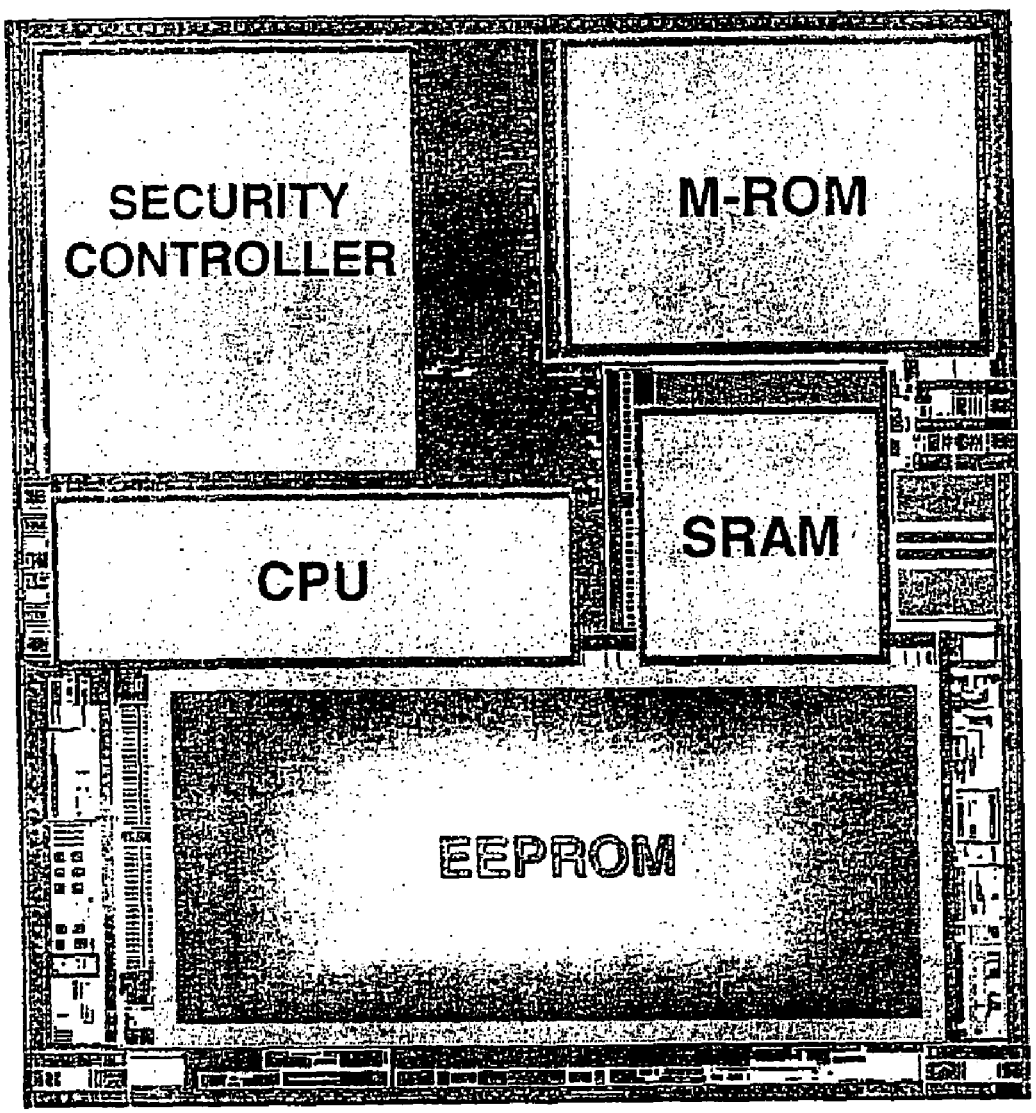
FIG. 6 is a schematic illustrating one exemplary data system employing non-volatile memory cells of the present invention.

As shown in FIG. 6, embodiments of the present invention can be applied to various electronic systems such as memory module or a smart card as shown. The smart card may include, for example, a security controller for encryption and/or decryption, M-ROM including chip operation system (COS) and basic input output system (BIOS), SRAM for temporary memory, and a central processing unit (CPU) for chip or data control in addition to the non-volatile memory cell.

In conclusion, according to one aspect of the present invention, because the erase gate 218 can be formed self-aligned with the floating gate 214 and/or the program gate 210, process margins can be substantially increased compared to the prior art. Also, according to another aspect of the present invention, because there are no separate word lines that should be physically separated by a sufficient amount from sense lines, the size of the device can be significantly reduced. In addition, according to still another aspect of the present invention, not only voltages applied to the junction regions but also the voltages applied from the program gate 210 can result in coupling of the floating gate 210. Thus, the charge or discharge operations can be performed with a significantly lower voltage compared to the prior art. In other words, with embodiments of the present invention, high voltages that have been required in the prior art devices need not be applied to the junction regions, causing punchthrough or disturbance between memory cells. As a result, the prior art problems such as punchthrough between the memory cells can be effectively prevented even when L3, i.e., the distance between the common source region 215 and the drain 219 is reduced. Thus, the device can be further scaled down without the problems of program disturbance or punchthrough.

It should be appreciated that reference throughout this specification to "one embodiment" or "an embodiment" means that a particular feature, structure or characteristic described in connection with the embodiment is included in at least one embodiment of the present invention. Therefore, it should be emphasized and appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Having described and illustrated the principles of the invention in a several preferred embodiments, it should be apparent that the embodiments may be modified in arrangement and detail without departing from such principles. We claim all modifications and variation coming within the spirit and scope of the following claims.

The invention claimed is:

1. A semiconductor device comprising:
    a gate dielectric layer formed on a semiconductor substrate;
    a floating gate overlying the gate dielectric layer, the floating gate having a first side surface and a second side surface opposite the first side surface;
    an insulated program gate having a side portion located at least along the first side surface, the program gate overlying the gate dielectric layer;
    an erase gate disposed adjacent the floating gate, the erase gate located at least along the second side surface, the erase gate overlying the gate dielectric layer;
    a coupling dielectric disposed between the floating gate and the program gate;
    a tunneling dielectric layer disposed between the floating gate and the erase gate;
    a first impurity region and a second impurity region formed in the semiconductor substrate along opposite sides of the floating gate; and
    a channel region within the semiconductor substrate between the first and second impurity regions, wherein the first and second side surfaces of the floating gate are directly over the channel region.

2. The semiconductor device of claim 1, wherein a capacitive coupling ratio between the program gate and the floating gate is greater than a capacitive coupling ratio between the program gate and the erase gate.

3. The semiconductor device of claim 2, wherein the thickness of the coupling dielectric layer is less than or approximately equal to thickness of the tunneling dielectric layer.

4. The semiconductor device of claim 3, wherein the thickness of the coupling dielectric layer ranges from about 40 angstroms to about 200 angstroms.

5. The semiconductor device of claim 4, wherein the thickness of the coupling dielectric layer ranges from about 60 angstroms to 120 angstroms.

6. The semiconductor device of claim 3, wherein the thickness of the tunneling dielectric layer is greater than or equal to the thickness of the coupling dielectric layer, but not greater than three times the thickness of the coupling dielectric layer.

7. The semiconductor device of claim 6, wherein the thickness of the tunneling dielectric layer is thin enough to allow F-N tunneling between the floating gate and the erase gate.

8. The semiconductor device of claim 2, wherein the floating gate and the program gate has a first overlapping area therebetween and the program gate and the erase gate has a second overlapping area therebetween, and wherein the first overlapping area is greater than the second overlapping area.

9. The semiconductor device of claim 8, wherein the first overlapping area is at least about 2 times the size of the second overlapping area and no greater than 5 times the second overlapping area.

10. The semiconductor device of claim 1, wherein the program gate includes a top portion located above a region of a top surface of the floating gate.

11. The semiconductor device of claim 1, wherein the erase gate is self aligned with respect to the shapes of the program gate and the floating gate.

12. The semiconductor device of claim 1, wherein the gate dielectric layer is thicker than the coupling dielectric layer.

13. The semiconductor device of claim 1, wherein the first impurity region partially overlaps with the program gate to form a channel region thereunder in the semiconductor substrate.

14. The semiconductor device of claim 1, wherein the first impurity region fully overlaps with the program gate.

15. The semiconductor device of claim 1, further comprising a halo implant region formed adjacent the first impurity region.

16. The semiconductor device of claim 1, wherein a ratio of the overlapping length between the floating gate and the program gate to the overlapping length between the floating gate and the erase gate ranges from about 5:1 to about 20:1.

17. The semiconductor device of claim 16, wherein the ratio is about 10:1.

18. The semiconductor device of claim 1, wherein the floating gate has a tip formed at an edge thereof, and wherein the erase gate has a portion that directly overlies the tip.

19. The semiconductor device of claim 1, wherein the tunneling dielectric layer comprises a thermal oxide layer and a chemical vapor deposition (CVD) insulating layer, which are sequentially formed.

20. The semiconductor device of claim 1, wherein the floating gate has an undulating thickness that forms an uneven surface having a tip formed at an edge thereof.

21. The semiconductor device of claim 1, wherein the program gate has a thickness ranging from about 1,000 angstroms to 3,000 angstroms, wherein the floating gate has a thickness ranging from about 500 angstroms to about 2,500 angstroms, and wherein the erase gate has a thickness ranging from about 1,000 angstroms to 3,000 angstroms.

22. A semiconductor device comprising:
an insulated floating gate overlying a semiconductor substrate, the floating gate has a side surface;
an insulated program gate adjacent to the side surface of the floating gate;
an insulated erase gate adjacent to the floating gate;
a first dielectric layer between the insulated floating gate and the insulated program gate;
a second dielectric layer disposed between the insulated floating gate and the insulated erase gate, wherein a capacitive coupling ratio between the floating gate and the program gate is greater than a capacitive coupling ratio between the program gate and the erase gate; and
first and second junction regions disposed along opposite sides of the insulated floating gate.

23. The semiconductor device of claim 22, wherein the thickness of the first dielectric layer is substantially thinner than the thickness of the second dielectric layer.

24. The semiconductor device of claim 22, wherein an overlapping area between the floating gate and the program gate is greater than an overlapping area between the floating gate and the erase gate.

25. The semiconductor device of claim 22, wherein the insulated program gate is also formed on a region of a top surface of the floating gate.

26. The semiconductor device of claim 22, wherein the erase gate overlies the floating gate and the program gate, and wherein the erase gate is self-aligned with respect to the shapes of the floating gate and the erase gate.

27. The semiconductor device of claim 22, further comprising a selection transistor is coupled to the erase gate for byte operation.

28. A non-volatile memory comprising:
an insulated floating gate disposed on a semiconductor substrate and having a first height;
an insulated program gate that partially overlaps the floating gate and that has a second height that is greater than the first height; and
an insulated erase gate that partially overlaps the floating gate and that has a third height that is greater than the second height.

29. The memory of claim 28, wherein the program gate and the erase gate are each disposed both on a top and to a side of the floating gate.

30. The memory of claim 28, further comprising:
a coupling dielectric layer disposed between the floating gate and the program gate; and
a tunneling dielectric layer disposed between the floating gate and the erase gate, the tunneling dielectric layer thicker than the coupling dielectric layer.

31. The memory of claim 28, further comprising:
a first junction that is partially overlapped by the erase gate, the first junction formed in the semiconductor substrate; and
a second junction that is partially overlapped by the program gate, the second junction formed in the semiconductor substrate.

32. The memory of claim 28, further comprising:
a halo junction adjacent the second junction and is partially overlapped by the program gate.

33. The memory of claim 1, wherein an upper part of the erase gate extends higher than an upper part of the program gate.

34. A system comprising:
a non-volatile memory comprising:
an insulated floating gate overlying a semiconductor substrate, the floating gate has a side surface;
an insulated program gate formed at least on the side surface of the floating gate;
an erase insulated gate disposed adjacent the floating gate;
a first dielectric layer disposed between the insulated floating gate and the insulated program gate;
a second dielectric layer disposed between the insulated floating gate and the insulated erase gate, wherein a capacitive coupling ratio between the floating gate and the program gate is greater than a capacitive coupling ratio between the program gate and the erase gate; and
first and second junction regions disposed along opposite sides of the insulated floating gate; and
a central processing unit (CPU) in electrical communication with the non-volatile memory.

35. The system of claim 34, further comprising a security controller.

36. The system of claim 35, further comprising SRAM.

37. The system of claim 36, further comprising M-ROM.

38. The semiconductor device of claim 1, further comprising a lightly doped drain (LDD) region adjacent to the first impurity region, wherein a dopant concentration within the LDD region is less than a dopant concentration within the first impurity region.

39. A semiconductor device comprising:
a memory cell, the memory cell comprising:
a gate dielectric layer formed on a semiconductor substrate;
a floating gate overlying the gate dielectric layer, the floating gate having a first side surface and a second side surface opposite the first side surface;
a program gate having a side portion located at least along the first side surface, the program gate overlying the gate dielectric layer;
an erase gate adjacent to the floating gate, the erase gate located at least along the second side surface, the erase gate overlying the gate dielectric layer;

a coupling dielectric between the floating gate and the program gate;

a tunneling dielectric layer between the floating gate and the erase gate;

a source region in the semiconductor substrate adjacent to the program gate; and a drain region in the semiconductor substrate adjacent to the erase gate;

an interlayer dielectric over the memory cell; and a bit line extending through the interlayer dielectric and contacting the drain region.

* * * * *